United States Patent

Ballantyne

[19]

[11] Patent Number: 6,069,526
[45] Date of Patent: May 30, 2000

[54] PARTIAL OR COMPLETE AMPLIFIER BYPASS

[75] Inventor: Gary J. Ballantyne, San Diego, Calif.

[73] Assignee: Qualcomm Incorporated, San Diego, Calif.

[21] Appl. No.: 09/129,020

[22] Filed: Aug. 4, 1998

[51] Int. Cl.[7] .................................................. H03F 1/14
[52] U.S. Cl. .......................................... 330/51; 330/151
[58] Field of Search .............................. 330/51, 151, 284, 330/302, 310

[56] References Cited

U.S. PATENT DOCUMENTS

| | | | |
|---|---|---|---|
| 3,325,738 | 6/1967 | Busby et al. | 325/477 |
| 3,469,195 | 9/1969 | Harwood | 325/405 |
| 3,514,710 | 5/1970 | Janning | 330/29 |
| 3,665,507 | 5/1972 | Pell | 325/315 |
| 3,886,380 | 5/1975 | Sobajima et al. | 307/237 |
| 4,041,396 | 8/1977 | Fedde | 325/150 |
| 4,054,849 | 10/1977 | Yamada | 333/14 |
| 4,158,180 | 6/1979 | Challen | 330/298 |
| 4,207,538 | 6/1980 | Goel | 330/277 |
| 4,223,274 | 9/1980 | Paulke et al. | 330/133 |
| 4,263,560 | 4/1981 | Ricker | 330/129 |
| 4,320,350 | 3/1982 | Drapac | 330/202 |
| 4,380,711 | 4/1983 | Cunningham | 307/491 |
| 4,426,625 | 1/1984 | Harwood et al. | 330/254 |
| 4,439,744 | 3/1984 | Kumar et al. | 330/285 |
| 4,447,783 | 5/1984 | Quick | 323/275 |
| 4,495,648 | 1/1985 | Giger | 455/73 |
| 4,500,848 | 2/1985 | Marchand et al. | 330/285 |
| 4,510,460 | 4/1985 | Tamura | 330/285 |
| 4,514,702 | 4/1985 | Zogg | 330/254 |
| 4,523,155 | 6/1985 | Walczak et al. | 330/279 |
| 4,560,949 | 12/1985 | Young | 330/284 |
| 4,592,252 | 6/1986 | Ecer | 76/108 |
| 4,593,409 | 6/1986 | Miller | 455/73 |
| 4,602,218 | 7/1986 | Vilmur et al. | 330/279 |
| 4,607,234 | 8/1986 | Nordholt et al. | 330/278 |
| 4,613,990 | 9/1986 | Halpern | 455/33 |
| 4,654,882 | 3/1987 | Ikeda | 455/88 |
| 4,661,993 | 4/1987 | Leland et al. | 455/103 |

(List continued on next page.)

FOREIGN PATENT DOCUMENTS

| | | | |
|---|---|---|---|
| 0537733 | 4/1993 | European Pat. Off. | H03G 3/20 |
| 0594358 | 4/1994 | European Pat. Off. | H03G 3/20 |
| 57-20693 | 11/1982 | Japan | H03G 11/00 |

OTHER PUBLICATIONS

"The Exploratory Develpoment of A High Power S–Band Solid State Radar Transmitter" by Hay et al., IEEE Int'l Radar Conf., May 7–10, 1990, pp. 135–140.

Presentation "A 900 MHz CMOS RF Power Amplifier With Programmable Output Power", by Rofougaran et al., Integrated Circuits & Systems Lab., UCLA.

*Primary Examiner*—Steven J. Mottola
*Attorney, Agent, or Firm*—Russell B. Miller; Brian S. Edmonston; Thomas R. Rouse

[57] ABSTRACT

A power amplifier circuit arrangement particularly useful for portable phones used in wireless systems. A power amplifier stage can be partially or completely bypassed so that multi-stage amplifiers can be built that allow wide dynamic range of power amplification to be obtained efficiently. A switch at the input of an amplifier stage couples an input signal either to an amplifier or to a bypass path. The output of the amplifier is coupled to a first impedance-transforming network. The bypass path includes a second impedance-transforming network. A third impedance transforming network couples the outputs of the first and second impedance transforming networks. The impedance transforming networks are constructed and arranged so that input and output signals see the correct load regardless of whether the amplifier is used or bypassed. Using the principles of this invention, multi-stage amplifiers can be constructed including input and bypass attenuators to achieve a wide range of gain levels.

14 Claims, 6 Drawing Sheets

U.S. PATENT DOCUMENTS

| | | | |
|---|---|---|---|
| 4,709,403 | 11/1987 | Kikuchi | 455/126 |
| 4,723,304 | 2/1988 | Maeda | 455/69 |
| 4,727,337 | 2/1988 | Jason | 330/298 |
| 4,740,964 | 4/1988 | Stalik | 370/110.1 |
| 4,797,632 | 1/1989 | Guery | 330/285 |
| 4,816,772 | 3/1989 | Klotz | 330/254 |
| 4,870,698 | 9/1989 | Katsuyama et al. | 455/67 |
| 4,893,093 | 1/1990 | Cronauer et al. | 330/295 |
| 4,901,032 | 2/1990 | Komiak | 330/277 |
| 4,901,307 | 2/1990 | Gilhousen et al. | 370/18 |
| 5,029,298 | 7/1991 | Chiba et al. | 330/258 |
| 5,083,096 | 1/1992 | Miyazaki | 330/279 |
| 5,099,204 | 3/1992 | Wheatley, III | 330/279 |
| 5,107,225 | 4/1992 | Wheatley, III et al. | 330/279 |
| 5,128,627 | 7/1992 | Wendt | 330/51 |
| 5,132,634 | 7/1992 | Suarez | 330/129 |
| 5,136,300 | 8/1992 | Clarke et al. | 342/175 |
| 5,146,180 | 9/1992 | Hyakutake | 330/254 |
| 5,152,004 | 9/1992 | Vaisanen et al. | 455/68 |
| 5,163,181 | 11/1992 | Koontz | 455/103 |
| 5,175,871 | 12/1992 | Kunkel | 455/69 |
| 5,192,919 | 3/1993 | Wieczorek | 330/129 |
| 5,251,330 | 10/1993 | Chiba et al. | 455/91 |
| 5,256,987 | 10/1993 | Kibayashi et al. | 330/295 |
| 5,287,543 | 2/1994 | Wolkstein | 455/13.3 |
| 5,329,548 | 7/1994 | Borg | 375/1 |
| 5,339,046 | 8/1994 | Kornfeld et al. | 330/277 |
| 5,420,537 | 5/1995 | Weedon et al. | 330/251 |
| 5,438,684 | 8/1995 | Schwent et al. | 455/89 |
| 5,457,427 | 10/1995 | Wong et al. | 330/302 |
| 5,487,185 | 1/1996 | Halonen | 455/127 |
| 5,530,923 | 6/1996 | Heinonen et al. | 330/51 X |
| 5,541,554 | 7/1996 | Stengel et al. | 330/51 |
| 5,542,096 | 7/1996 | Cygan et al. | 455/115 |
| 5,548,246 | 8/1996 | Yamamoto et al. | 330/51 |
| 5,568,086 | 10/1996 | Schuss et al. | 330/124 |
| 5,608,353 | 3/1997 | Pratt | 330/295 |
| 5,678,208 | 10/1997 | Kowalewski et al. | 455/115 |
| 5,909,643 | 6/1999 | Aihara | 330/51 X |

PARTIAL OR COMPLETE AMPLIFIER BYPASS

BACKGROUND OF THE INVENTION

1. Field of the Invention

The present invention relates, in general, to radio frequency (RF) power amplifiers. It is particularly useful in the type of RF power amplifiers used in wireless telephones.

2. Description of the Related Art

Code Division Multiple Access (CDMA) modulation techniques are one of several techniques for facilitating communications in which a large number of system users are present. Although other techniques, such as time division multiple access (TDMA), frequency division multiple access (FDMA), and amplitude modulation (AM) modulation schemes such as amplitude companded single sideband (ACSSB) are known, CDMA has significant advantages over these other techniques. The use of CDMA techniques in a multiple access communication system is disclosed in U.S. Pat. No. 4,901,307 entitled "Spread Spectrum Multiple Access Communication System Using Satellite Or Terrestrial Repeaters," assigned to the assignee of the present invention, the disclosure thereof incorporated by reference.

In wireless telephone systems, a plurality of wireless telephones communicate with one or more base stations within "cells." In Code Division Multiple Access (CDMA) wireless telephone systems, in particular, wherein all portable users within a cell are sharing the same band of frequencies, but using different codes to modulate their respective signals, each wireless telephone's transmitter signal becomes noise to all of the others. Keeping the overall noise level down tends to help all users. This is particularly true for IS-95, the CDMA standard. Wireless telephones are called upon to transmit at a wide range of power levels depending upon conditions existing at the time of transmission. A mobile CDMA phone is required to transmit at maximum power relatively infrequently. For the greater part of the time it is better to transmit at relatively low power levels. When low power levels are required it is desirable that the current-consuming high-power stages be turned off, and bypassed. Typically, CDMA wireless phones operate at a large number of discrete power levels; the levels are selected in response to changing transmission conditions.

Since wireless telephones operate on battery power, it is also desirable that their transmitters operate as efficiently as possible to conserve power and extend battery life. Ideally for CDMA systems, such as those governed by the IS-95 standard, power amplifier stages should be capable of efficient, linear operation over their required dynamic range. However, the state of the art has not yet come close to the ideal and many wireless telephones now in use have poor power management. During low power transmissions, power is wasted by cascaded amplifier stages that are not needed. Consequently, attempts have been made to bypass unused stages.

Such attempts have required the high power amplifier's output to pass through a switch. For example, see U.S. Pat. No. 5,661,434, issued Aug. 26, 1997 to Brozovich et. al. entitled "High Efficiency Multiple Power Level Amplifier Circuit," the subject matter of which is incorporated herein by reference. Brozovich et al utilizes three single-pole single-throw switches to bypass stages of a multi-stage amplifier. A bypass switch is always in series with the amplifier stage to be bypassed. However, it is difficult to utilize switches in series with high power amplifier stages. Generally, switches have a loss associated with them. Forcing the output of high power amplifier stages through a switch can cause an unacceptable loss. Furthermore, the types of switches that must be used for high power are both large and expensive, causing unacceptable design constraints. Consequently, there is a need for High Efficiency Power Amplifier (HEPA) circuits for CDMA wireless telephone applications that can bypass amplifier stages when the stages are not necessary.

A High Efficiency Power Amplifier (HEPA) may not be efficient in the traditional sense. Amplifier efficiency is most often specified at maximum output power. The efficiency of class A amplifiers and class AB amplifiers tends to zero as the output power is reduced. High efficiency in the "HEPA" sense refers to the average current drawn by the amplifier in a specified operating environment. As discussed in copending U.S. patent application Ser. No. 08/579,169 entitled "Efficient Parallel-Stage Power Amplifier," filed Dec. 25, 1995 and assigned to the assignee of the present invention, and hereby incorporated by reference, and additionally copending U.S. patent application Ser. No. 08/767,124 entitled "Efficient Parallel-Stage Power Amplifier," filed Dec. 9, 1996 also assigned to the assignee of the present invention, also hereby incorporated by reference, the utilization of these types of power control techniques requires that the portable unit transmitter be capable of linear operation over a relatively wide dynamic range.

The operating environment of a CDMA wireless telephone is typically urban or suburban. Both environments have common salient features: the probability of operating at high output power (such as more than 15 dBm for IS-95), or at low output power (such as less than −15 dBm for IS-95) is small. It is most probable that the power amplifier output power is in the neighborhood of 0 dBm. Power amplifiers that are efficient at high output power (28 dBm for IS-95) are usually not efficient at 0 dBm.

The cause of low efficiency in Class A and class AB amplifiers at low output power is their idle or quiescent current. The level of quiescent current is chosen to satisfy the design requirements at maximum output power, but is typically still drawn from the supply when the power amplifier is not transmitting at maximum power. Since the power amplifier is seldom at maximum power the quiescent current is wasted most of the time.

A typical power amplifier consists of several serial stages. Each stage is usually larger, and more powerful than the previous one. Most of the quiescent current is drawn by latter high power stages, which are not required for the low output power levels at which the phone is often called upon to transmit. It follows that bypassing the high power stages when they are not required can make a significant saving in current.

Of course, the individual stages of a power amplifier add more than power, they add gain. Fortunately, the decrease in gain that accompanies bypassed stages is a bonus, as it decreases the dynamic range required by previous circuitry.

SUMMARY OF THE INVENTION

In general, the object of some embodiments of this invention is to provide a practical arrangement for a multi-stage power amplifier that can be efficiently operated at various power and gain levels in a wireless telephone.

It is an object of some embodiments of this invention to provide a multi-stage power amplifier that conserves current during low power transmission by bypassing stages through parallel bypass paths without requiring the output of a high power RF amplifier to pass through a switch.

These objectives are accomplished in some embodiments by providing one or more amplifier stages of the general form shown in FIG. 1. A switch is provided at the input of an amplifier stage. This input switch can route the signal to be amplified either through an amplifier or bypass it around the amplifier. The key to this arrangement is the use of three impedance transforming network networks. A first impedance-transforming network is provided at the output of the amplifier itself. A second impedance-transforming network is provided in the bypass path. A third impedance transforming network couples the output of the second impedance-transforming network to the output of the first impedance-transforming network, making the third impedance-transforming network common to both bypass and amplifying nodes. The networks are each designed so that the input signal to be amplified or bypassed, as the case may be, will always be transmitted through the proper impedance. When operating in an amplifying mode, the input signal is routed through the amplifier and is properly matched via the first impedance-transforming network to the next stage. However, when operating in a bypass mode, the input signal passes through the second and third impedance transforming networks to the next stage and the amplifier can be substantially shut down.

The circuit arrangement according to this invention allows a signal to be routed around an amplifier without requiring the amplifier output to pass through a switch. One advantage to this arrangement is to reduce the average current consumption of a power amplifier by bypassing high-power stages when they are not required. Another advantage is that bypassing amplifier stages reduces the gain of the transmitter. This can reduce the required dynamic range of other power/gain control circuitry in a wireless phone.

BRIEF DESCRIPTION OF THE DRAWINGS

The foregoing and other objects, features, and advantages of the present invention will be better understood in view of the following detailed description made in conjunction with the accompanying drawing in which.

DETAILED DESCRIPTION OF THE INVENTION

Figure 1:
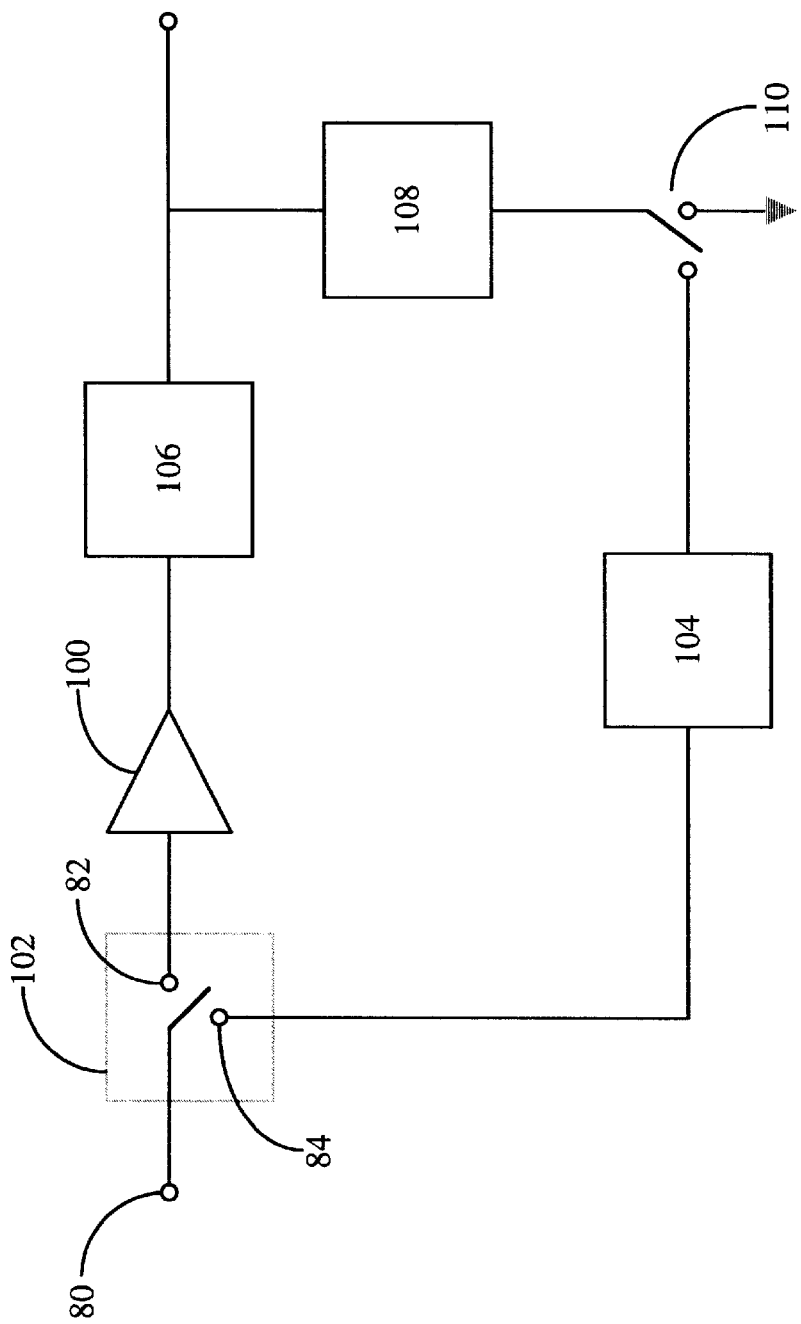
FIG. 1 is a block diagram showing the concept of the invention in its broadest form.

FIG. 1 is a schematic diagram illustrating the general concept of the invention. A single stage amplifier is shown. In this embodiment, the single amplifier 100 represents the final, high power RF amplifier of a wireless telephone. An input signal to be amplified is coupled to a pole 80 of a switch 102. Switch 102 can be operated so as to couple the input signal at pole 80 to either throw 82 or to throw 84. Throw 82 is coupled to the input of amplifier 100. The output of amplifier 100 is coupled to a first side of an impedance-transforming network 106, the second side of which provides the output 112 for the amplifier stage. Throw 84 of switch 102 is coupled to a first side of an impedance-transforming network 104. Another impedance transforming network 108 has a first side directly coupled to the second side of impedance transforming network 106 and to output 112. A second side of impedance transforming network 108 is switched by a switch 110 between a second side of impedance transforming network 104 and ground. The operation of switch 110 is coordinated with the operation of switch 102. The impedance transforming networks have impedance values selected so that in an amplifying mode, when the input signal is coupled via switch 102 to amplifier 100, the output of amplifier 100 sees the correct load impedance through impedance transforming network 106. When operating in bypass mode, when switch 102 routes the input signal through impedance transforming network 104, the input signal also sees the correct load impedance through impedance transforming network 104.

Figure 2:
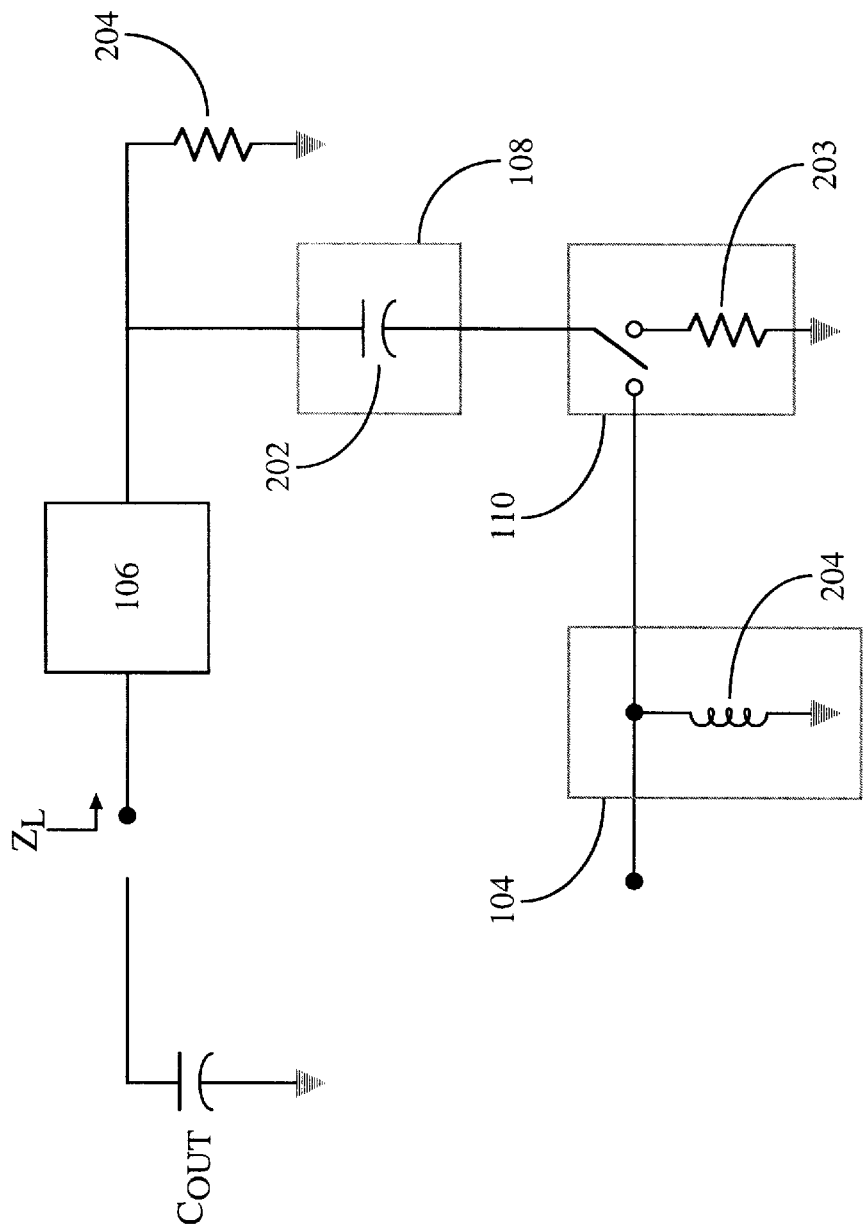
FIG. 2 is a schematic diagram explaining the design concepts of the impedance transforming networks.

The design concepts of the impedance transforming networks will be explained with reference to FIGS. 2 and 3. FIG. 2 is a schematic diagram of a simplified circuit arrangement in accordance with the concepts of the present invention. SPDT switch 110 toggles between the regular (amplifying) and bypass modes. When the switch is vertical, the shunt capacitor 202 (constituting impedance transforming network 108) completes the output impedance transforming network, presenting a load impedance $Z_L$ to amplifier 100 (not shown) through impedance transforming network 106. The 1Ω resistance 203 in series with shunt capacitor 202 represents the series loss of an actual switch 110, preferably constituted by a PIN diode.

The 1Ω series resistance 203 of the switch can be transformed across the 50Ω load 204 using a simple series to parallel conversion with the shunt capacitor 202 having an impedance of, for example, −j50Ω at the operating frequency. The large series impedance of 202 corresponds to a large transformed resistance across the load, which reduces circuit losses. In an actual circuit, a series reactance of around j−j50Ω corresponds to a loss of approximately 0.1 dB, as is a reasonable starting value.

The impedance-transforming network 106 performs two functions. When the switch 110 is vertical, in the amplifying/orthodox mode of operation, the impedance-transforming network 106 presents an impedance, $Z_L$ to the final stage amplifier 100 (not shown in this Figure). When the final stage amplifier 100 is turned off, the network transforms the device's output capacitance ($C_{out}$) to the j50Ω reactance shown.

Figure 3:
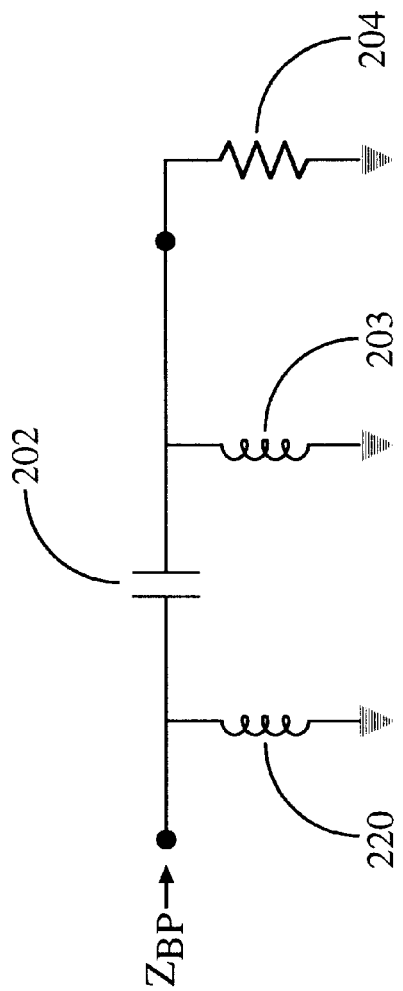
FIG. 3 is a schematic diagram of the equivalent circuit of the impedance transforming circuits in bypass mode.

FIG. 3 is a schematic representation of the situation that exists when switch 110 is horizontal and operation is in the bypass mode. The output capacitance of the final stage device, transformed to j50Ω, appears to be in parallel with the load 204. A second shunt j50Ω reactance 220 forms a classic "π" lumped approximation to a λ/2 transmission line at the operating frequency, so that the impedance looking into the bypass, $Z_{BP}$, is just 50Ω. The great advantage of this circuit is the ability to bypass a high power stage without a switch in the large signal path.

Figure 4:
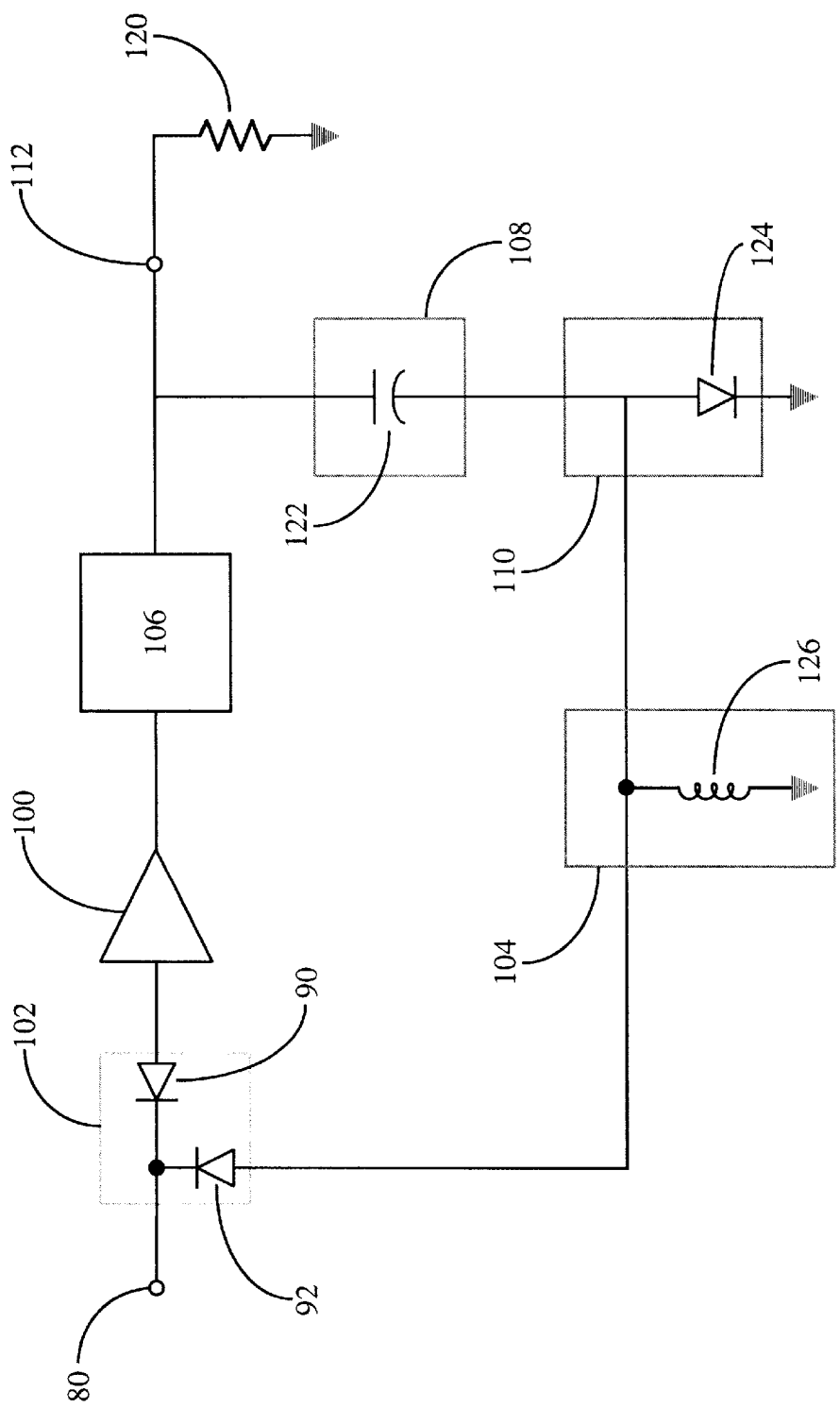
FIG. 4 is a schematic diagram showing a practical circuit arrangement based on the concept shown broadly in FIG. 1.

FIG. 4 is a schematic diagram of a simplified circuit arrangement for an RF power amplifier based on the principles of the invention. A single pole double throw (SPDT) switch 102 toggles between an amplifying mode of operation and a bypass mode of operation for this amplifier stage. In this case switch 102 is implemented by a pair of PIN diodes 90 and 92, which can be turned on and off electrically.

The output of amplifier 100 sees impedance $Z_L$ looking into impedance transforming network 106 in the amplifying mode. Output node 112 sees impedance of j50Ω looking back into the output end of impedance transforming network 106 when the amplifier is being bypassed. A load of 50Ω is attached to output node 112. Impedance transforming network 108 is formed by a single capacitor 122 having impedance of −j50Ω at the operating frequency. Switch 110 is constituted by a PIN diode 124. Impedance transforming network 104 is constituted by an inductor 126 having an impedance j50Ω at the operating frequency.

There are many possible variations on the implementation of the HEPA block diagram of FIG. 1, which, depending on the device technology, packaging, and other details, may give better performance or reduce cost.

Figure 5:
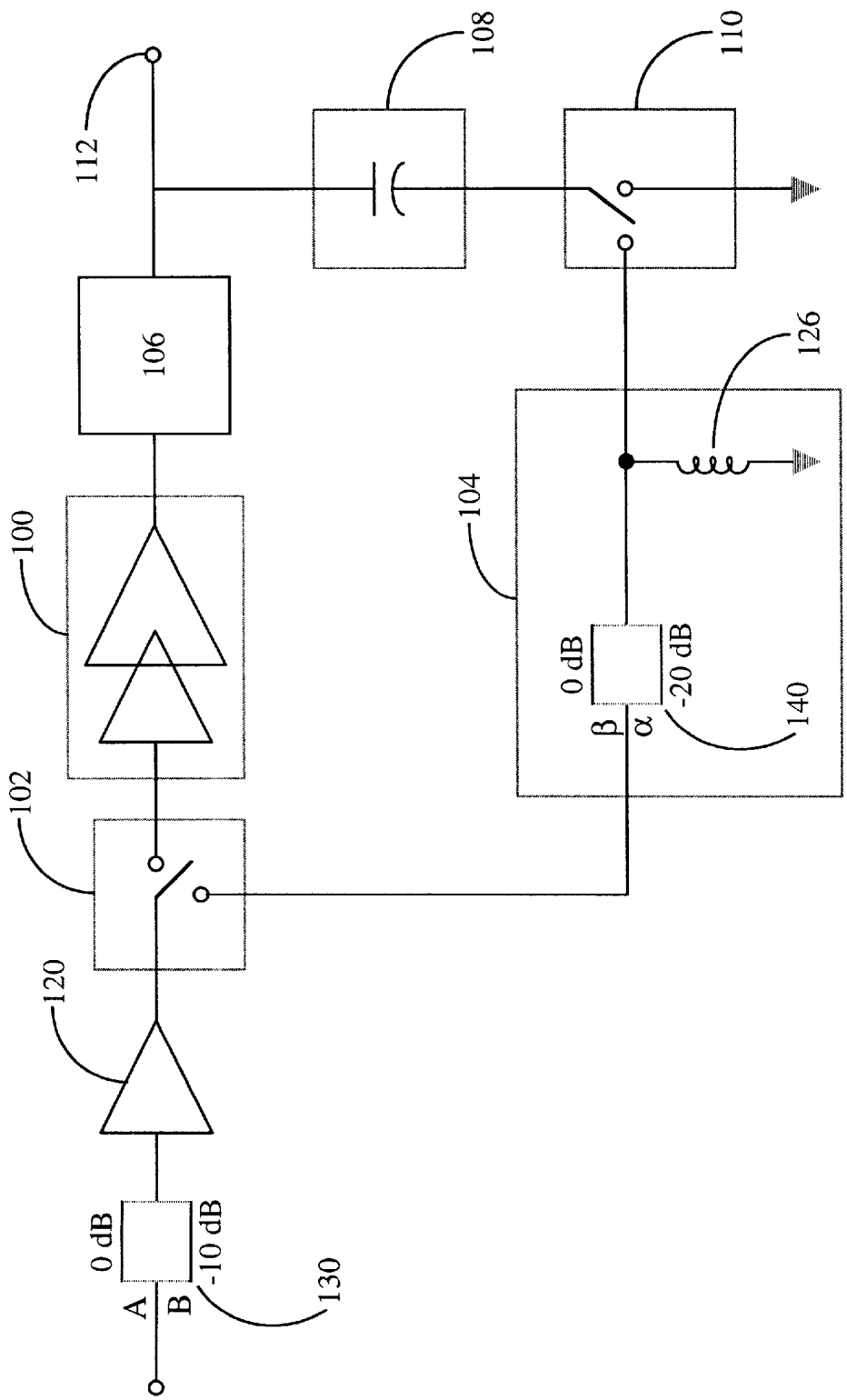
FIG. 5 is a schematic diagram of a three stage amplifier in accordance with the principles of the present invention.

FIG. 5 is a schematic diagram of a three-stage high efficiency power amplifier (HEPA) based on the principles of the present invention. The final two stages of amplification are represented by amplifier 100. The important, "current saving" feature of the circuit is the bypass around the final two stages 100. The bypass allows these stages to be inactive (drawing zero, or little, current) when high output power is not required.

In addition to reducing average current a HEPA circuit can also provide several discrete gain steps. This is achieved with switchable attenuators 130 and 140. Six discrete gain levels can be achieved, depending upon the state of the two attenuators and bypass. The discrete gain levels are shown in Table 1, as follows.

TABLE 1

| Mode | Configuration | Mode | Gain | High/Low Quiescent current |
|------|---------------|------|------|---------------------------|
| 1 | A/α | Amp. | 30 | High |
| 1a | B/α | Amp. | 20 | High |
| 2 | A/β | B.P. | 10 | Low |
| 3 | B/β | B.P. | 0 | Low |
| 3a | A/γ | B.P. | −10 | Low |
| 4 | B/γ | B.P. | −20 | Low |

In one embodiment of the invention, attenuator 140 is set to its highest attenuation setting in the amplifying mode to improve the reverse isolation.

Amplifier 120 is arranged to be active in each of the power modes described above. When the amplifier gain and the attenuator attenuation are equal, the series combination of attenuator 130 and amplifier 120 is functionally equivalent to bypassing the amplifier 120 whenever the attenuator 130 is on. The advantage of bypassing the amplifier 120 is that its quiescent current is conserved when not required. However the bypassing circuitry is more complex, and would, as a practical matter, require greater circuit board area than an attenuator would require. Moreover the actual savings, in terms of average current, are scaled by the fraction of time the power amplifier spends in this mode.

As an alternative, attenuator circuit 130 preceding amplifier 120 could be replaced by an additional attenuation stage in the bypass path. In such an arrangement, the bypass attenuator would then have three attenuation levels, rather then the two shown in FIG. 4. The additional attenuator in the bypass path would most likely need to have a large value, such as greater than 30 dB, which may present practical design difficulties using discrete components. However, it is certainly achievable using an integrated solution, and offers the possibility of a single integrated circuit HEPA solution by including the SPDT switch.

Attenuator 130 at the input of amplifier 120 is smaller than attenuator 140 in the bypass path. However, it can be advantageous to place the larger attenuator before the first stage and the smaller attenuator in the bypass path. However, a large attenuator in the bypass path improves the reverse isolation in the high power/high gain mode.

Figure 6:
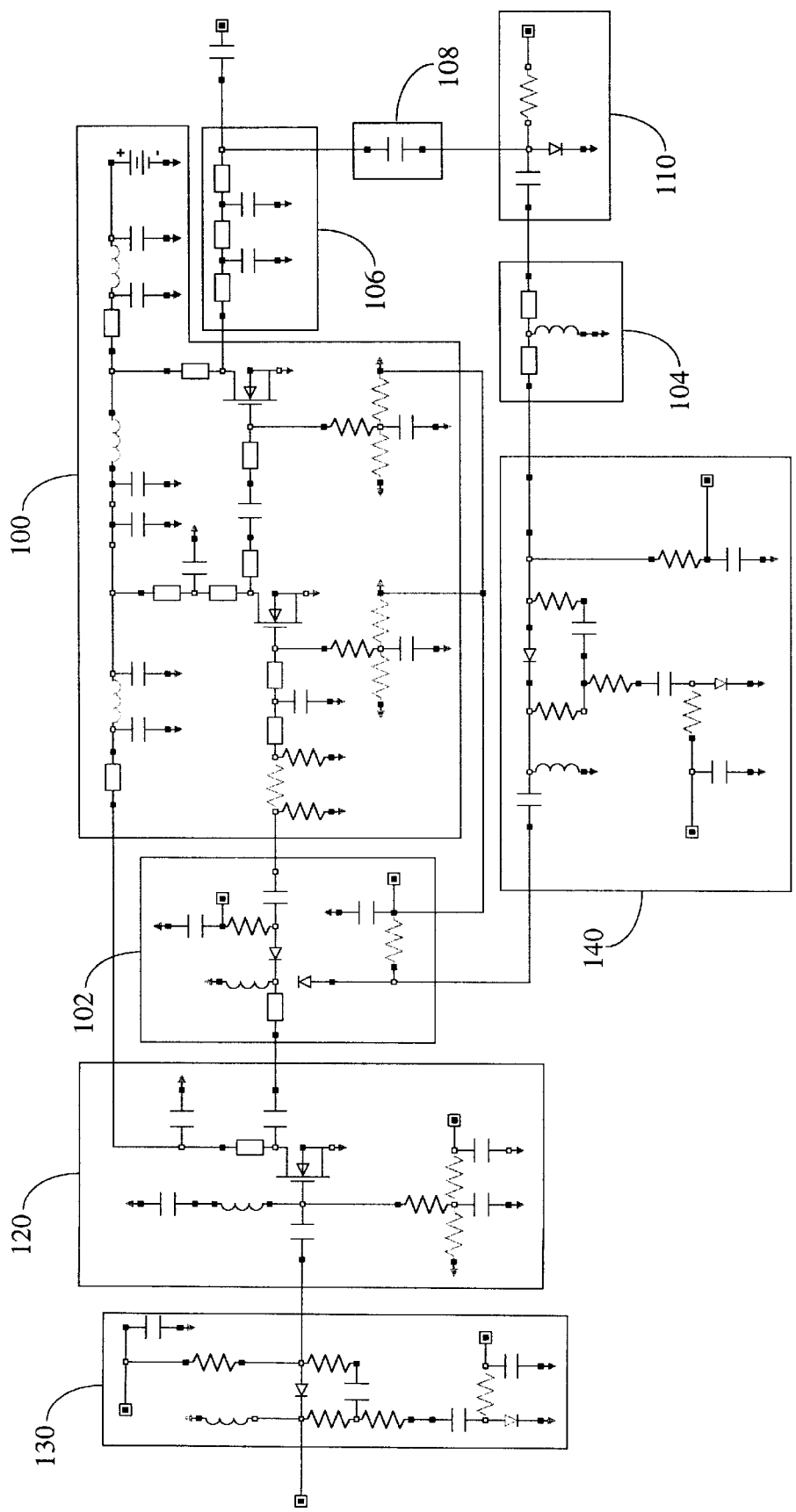
FIG. 6 is a schematic diagram of a practical three-stage amplifier utilizing the principles of the invention.

The attenuator 140 in the bypass path can be removed and placed immediately after the first amplifier stage 120 but before the switch 102. When the attenuator 140 placed after the first stage amplifier 120, additional control over the high power mode gain is possible. This could be advantageous, for example, to manage the reduction in gain when the amplifier is operating at high temperature or is heavily compressed. FIG. 6 is a detailed schematic diagram of a circuit arranged for a three stage HEPA utilizing the principles of the invention. The three amplifier stages use 64 mm, 16 mm (100) and 4 mm (120) gate width metal oxide semiconductor (MOS) devices. A modified "T"-pad circuit forms the switchable attenuators in the bypass path 104 and at the input of the first stage amplifier 120, while a SPDT switch is fashioned from two PIN diodes 102. The bypass circuit relies on a shunt diode in 110.

What is claimed is:

1. A power amplifier circuit arrangement, comprising:
an input circuit for receiving an input signal; an amplifier;
an output circuit for producing an output signal from the amplifier circuit;
a first impedance transforming network having a first end coupled to an output of the amplifier and a second end coupled to the output circuit;
a second impedance transforming network having first and second ends;
a first switch for coupling an input signal to either the amplifier or to the first end of the second impedance-transforming network;
a third impedance transforming network having a first end coupled to the second end of the first impedance transforming network and a second end;
a second switch for coupling the second end of the third impedance transforming network to either the second end of the second impedance transforming network or to ground, operation of the second switch being coordinated with operation of the first switch such that the amplifier is bypassed when the first switch couples the input signal to the second impedance transforming network and the second switch couples the second end of the second impedance transforming network to the third impedance transforming network, the first and second switches and the second impedance transforming network constituting a bypass circuit.

2. A power amplifier circuit arrangement according to claim 1 further comprising an attenuator in the bypass circuit.

3. A power amplifier according to claim 1 wherein the first switch is constituted by at least one diode.

4. A power amplifier according to claim 1 wherein the second switch is constituted by at least one diode.

5. A power amplifier according to claim 1 wherein the third impedance transforming network is constituted by a capacitor.

6. A power amplifier according to claim 1 wherein the second impedance transforming network is constituted by an inductor.

7. A power amplifier circuit arrangement, comprising:
an input circuit for receiving an input signal; an amplifier;
an output circuit for producing an output signal from the amplifier circuit;

a first amplifier;

a first attenuator coupling the input circuit to an input of the first amplifier;

a first switch for coupling an output of the first amplifier to either a first or second node;

a second attenuator coupled to the second node;

a second amplifier having an input coupled to the first node;

a first impedance transforming network having a first end coupled to an output of the second amplifier and a second end coupled to the output circuit;

a second impedance transforming network having a first end coupled to a second end of the first impedance transforming network and a second end; and a second switch for coupling the second end of the second impedance transforming network to either the output of the second attenuator or to ground.

8. A power amplifier circuit arrangement according to claim 7 wherein the second amplifier comprises first and second amplifier devices.

9. A power amplifier circuit arrangement according to claim 7 wherein the first switch is constituted by at least one diode.

10. A power amplifier circuit arrangement according to claim 7 wherein the second switch is constituted by at least one diode.

11. A power amplifier circuit arrangement according to claim 7 wherein the first attenuator has a plurality of selectable degrees of attenuation.

12. A power amplifier circuit arrangement according to claim 7 wherein the second attenuator has a plurality of selectable degrees of attenuation.

13. A power amplifier circuit arrangement according to claim 10 wherein the first attenuator has a plurality of selectable degrees of attenuation.

14. A power amplifier circuit arrangement according to claim 7 wherein the second amplifier is comprised of a plurality of amplifier devices.

\* \* \* \* \*